United States Patent
Chen et al.

(10) Patent No.: US 10,989,453 B2
(45) Date of Patent: Apr. 27, 2021

(54) HEAT EXCHANGER WITH IMPROVED HEAT REMOVING EFFICIENCY

(71) Applicant: AURAS Technology Co., Ltd., New Taipei (TW)

(72) Inventors: Chien-An Chen, New Taipei (TW); Chien-Yu Chen, New Taipei (TW); Tian-Li Ye, New Taipei (TW)

(73) Assignee: AURAS TECHNOLOGY CO., LTD., New Taipei (TW)

( * ) Notice: Subject to any disclaimer, the term of this patent is extended or adjusted under 35 U.S.C. 154(b) by 174 days.

(21) Appl. No.: 16/387,598

(22) Filed: Apr. 18, 2019

(65) Prior Publication Data

US 2020/0271362 A1 Aug. 27, 2020

(30) Foreign Application Priority Data

Feb. 27, 2019 (TW) .................................. 108106814

(51) Int. Cl.
*F25B 39/04* (2006.01)
*F28D 7/00* (2006.01)

(52) U.S. Cl.
CPC ............ *F25B 39/04* (2013.01); *F28D 7/0066* (2013.01)

(58) Field of Classification Search
CPC ................................ F25B 39/04; F28D 7/0066
USPC ...................................................... 165/104.21
See application file for complete search history.

(56) References Cited

U.S. PATENT DOCUMENTS

| | | | | |
|---|---|---|---|---|
| 1,900,382 A | * | 3/1933 | Jaeger ...................... | B01J 8/067 422/659 |
| 2,156,053 A | * | 4/1939 | Fiene ........................ | F24D 1/00 237/9 R |
| 2,947,150 A | * | 8/1960 | Roeder, Jr. .............. | F25B 21/02 62/3.6 |
| 3,807,493 A | * | 4/1974 | Stewart ............... | F28D 15/0275 165/104.14 |
| 4,502,286 A | * | 3/1985 | Okada ................... | F25B 23/006 165/104.21 |
| 4,745,965 A | * | 5/1988 | Katsura ................. | F28D 15/025 122/366 |
| 4,949,164 A | * | 8/1990 | Ohashi .................. | H01L 23/427 165/104.33 |

(Continued)

FOREIGN PATENT DOCUMENTS

JP 11142023 A * 5/1999 ......... F28D 1/05375

*Primary Examiner* — Ljiljana V. Ciric
(74) *Attorney, Agent, or Firm* — WPAT, PC

(57) ABSTRACT

A heat exchanger includes a heat-absorbing part, two vapor conduits, a return conduit and a condensing part. The heat-absorbing part includes a vapor zone and a liquid zone. A first end of each vapor conduit is connected with the vapor zone of the heat-absorbing part. A first end of the return conduit is connected with the liquid zone of the heat-absorbing part. The condensing part includes a vapor-inputting chamber, a liquid-outputting chamber, a partition plate, a communication chamber, a first condenser tube group and a second condenser tube group. The vapor-inputting chamber is connected with a second end of each vapor conduit. The liquid-outputting chamber is connected with a second end of the return conduit. A loop is defined by the heat-absorbing part, the at least two vapor conduits, the return conduit and the condensing part collaboratively.

10 Claims, 4 Drawing Sheets

(56) References Cited

U.S. PATENT DOCUMENTS

| | | | | |
|---|---|---|---|---|
| 4,982,782 A * | 1/1991 | Albers | B01D 1/14 | 165/111 |
| 5,168,919 A * | 12/1992 | Berenholz | F28D 15/0233 | 165/104.33 |
| 5,186,242 A * | 2/1993 | Adachi | B60H 1/3202 | 165/110 |
| 5,186,248 A * | 2/1993 | Halstead | B60H 1/3227 | 165/153 |
| 5,224,358 A * | 7/1993 | Yamanaka | F25B 39/04 | 62/509 |
| 5,228,315 A * | 7/1993 | Nagasaka | F25B 39/04 | 165/110 |
| 5,394,710 A * | 3/1995 | Matsuo | B60H 1/3229 | 165/113 |
| 5,444,993 A * | 8/1995 | Yamamoto | F25B 39/04 | 62/196.4 |
| 5,502,582 A * | 3/1996 | Larson | F21V 15/04 | 349/62 |
| 5,592,830 A * | 1/1997 | Baba | F25B 39/04 | 165/132 |
| 5,613,552 A * | 3/1997 | Osakabe | F28D 15/0233 | 165/104.21 |
| 5,647,430 A * | 7/1997 | Tajima | F28D 15/0266 | 165/104.21 |
| 5,713,413 A * | 2/1998 | Osakabe | F28D 15/0233 | 165/104.33 |
| 5,806,583 A * | 9/1998 | Suzuki | F28D 15/0233 | 165/104.14 |
| 5,845,702 A * | 12/1998 | Dinh | F24F 3/1405 | 165/104.21 |
| 6,005,772 A * | 12/1999 | Terao | F28D 15/0233 | 165/104.21 |
| 6,026,891 A * | 2/2000 | Fujiyoshi | F28D 15/0233 | 165/104.33 |
| 6,039,111 A * | 3/2000 | Kawaguchi | F28D 15/0266 | 165/104.14 |
| 6,102,109 A * | 8/2000 | Osakabe | F28D 15/0233 | 165/104.21 |
| 6,119,767 A * | 9/2000 | Kadota | F28D 15/0233 | 165/104.33 |
| 6,357,517 B1 * | 3/2002 | Osakabe | H01L 23/427 | 165/104.21 |
| 6,382,308 B2 * | 5/2002 | Okamoto | F25B 23/006 | 165/104.21 |
| 6,397,934 B2 * | 6/2002 | Osakabe | F28D 15/0266 | 165/104.21 |
| 6,561,262 B1 * | 5/2003 | Osakabe | F28D 15/0266 | 165/104.21 |
| 6,591,902 B1 * | 7/2003 | Trent | F24F 1/0059 | 165/104.14 |
| 6,695,039 B1 * | 2/2004 | Reyzin | F28D 15/02 | 165/104.21 |
| 6,804,117 B2 * | 10/2004 | Phillips | F28D 15/0266 | 361/700 |
| 6,810,947 B2 * | 11/2004 | Tanaka | F28D 15/0233 | 165/104.21 |
| 6,863,119 B2 * | 3/2005 | Sugito | F28D 15/0266 | 165/104.33 |
| 7,017,657 B2 * | 3/2006 | Sugito | F28D 15/0233 | 165/104.21 |
| 7,063,129 B2 * | 6/2006 | Makino | F28D 15/0266 | 165/104.21 |
| 7,086,453 B2 * | 8/2006 | Lee | H01L 23/3672 | 165/104.33 |
| 7,422,052 B2 * | 9/2008 | Reyzin | H01L 23/427 | 165/104.21 |
| 7,562,695 B2 * | 7/2009 | Kadota | F28D 15/0233 | 165/53 |
| 7,652,884 B2 * | 1/2010 | Suzuki | G06F 1/203 | 361/699 |
| 7,672,125 B2 * | 3/2010 | Suzuki | G06F 1/203 | 361/695 |
| 7,701,715 B2 * | 4/2010 | Suzuki | G06F 1/203 | 361/699 |
| 7,710,722 B2 * | 5/2010 | Suzuki | G06F 1/203 | 361/699 |
| 7,775,262 B2 * | 8/2010 | Liu | H01L 23/427 | 165/104.26 |
| 7,942,194 B2 * | 5/2011 | Mochizuki | H01L 23/427 | 165/80.3 |
| 8,047,268 B1 * | 11/2011 | Kroliczek | F28D 15/043 | 165/104.26 |
| 8,050,036 B2 * | 11/2011 | Suzuki | G06F 1/203 | 361/699 |
| 8,289,701 B2 * | 10/2012 | Suzuki | F28F 9/0246 | 361/679.53 |
| 8,345,425 B2 * | 1/2013 | Toyoda | F28D 1/05366 | 361/700 |
| 8,929,073 B2 * | 1/2015 | Suzuki | F28D 15/046 | 361/700 |
| 9,007,771 B2 * | 4/2015 | Agostini | F28D 1/0435 | 361/701 |
| 9,062,919 B2 * | 6/2015 | Hanafusa | F25B 39/04 | |
| 9,113,578 B2 * | 8/2015 | Cottet | F28D 15/0266 | |
| 9,113,579 B2 * | 8/2015 | Cottet | H05K 7/20672 | |
| 9,702,635 B2 * | 7/2017 | Sun | F28D 15/043 | |
| 9,951,906 B2 * | 4/2018 | Kempes | F28D 15/0266 | |
| 9,964,362 B2 * | 5/2018 | Agostini | F28D 15/0266 | |
| 10,161,683 B2 * | 12/2018 | Singh | F28B 9/06 | |
| 2002/0124593 A1 * | 9/2002 | Yamazaki | B60H 1/3229 | 62/509 |
| 2004/0050537 A1 * | 3/2004 | Kim | F28D 5/02 | 165/115 |
| 2005/0006070 A1 * | 1/2005 | Kamiyama | F28D 1/0443 | 165/140 |
| 2006/0236717 A1 * | 10/2006 | Huang | F28D 1/05391 | 62/513 |
| 2008/0282730 A1 * | 11/2008 | Sanada | F28D 1/0443 | 62/507 |
| 2011/0220335 A1 * | 9/2011 | Fujii | F25B 39/04 | 165/173 |
| 2012/0111547 A1 * | 5/2012 | Suzuki | F28F 9/0212 | 165/173 |
| 2013/0025826 A1 * | 1/2013 | Sakamoto | H01L 23/427 | 165/104.21 |
| 2013/0206378 A1 * | 8/2013 | Kent | F25B 39/04 | 165/173 |
| 2013/0213624 A1 * | 8/2013 | Fujii | F28D 1/05375 | 165/173 |
| 2013/0284400 A1 * | 10/2013 | Lino | F25B 39/04 | 165/76 |
| 2013/0312937 A1 * | 11/2013 | Tsukinari | F28D 15/0266 | 165/104.21 |
| 2015/0027672 A1 * | 1/2015 | Jindou | F28F 13/06 | 165/143 |
| 2015/0083377 A1 * | 3/2015 | Jindou | F28D 1/05375 | 165/143 |
| 2016/0169596 A1 * | 6/2016 | Jindou | F25B 39/00 | 62/526 |
| 2016/0223265 A1 * | 8/2016 | Jindou | F24F 1/18 | |
| 2016/0238322 A1 * | 8/2016 | Inoue | F28D 1/05391 | |
| 2016/0320135 A1 * | 11/2016 | Inoue | F28F 9/22 | |
| 2017/0211868 A1 * | 7/2017 | Junge | F25B 5/00 | |
| 2017/0307301 A1 * | 10/2017 | Sorensen | F28D 15/025 | |

\* cited by examiner

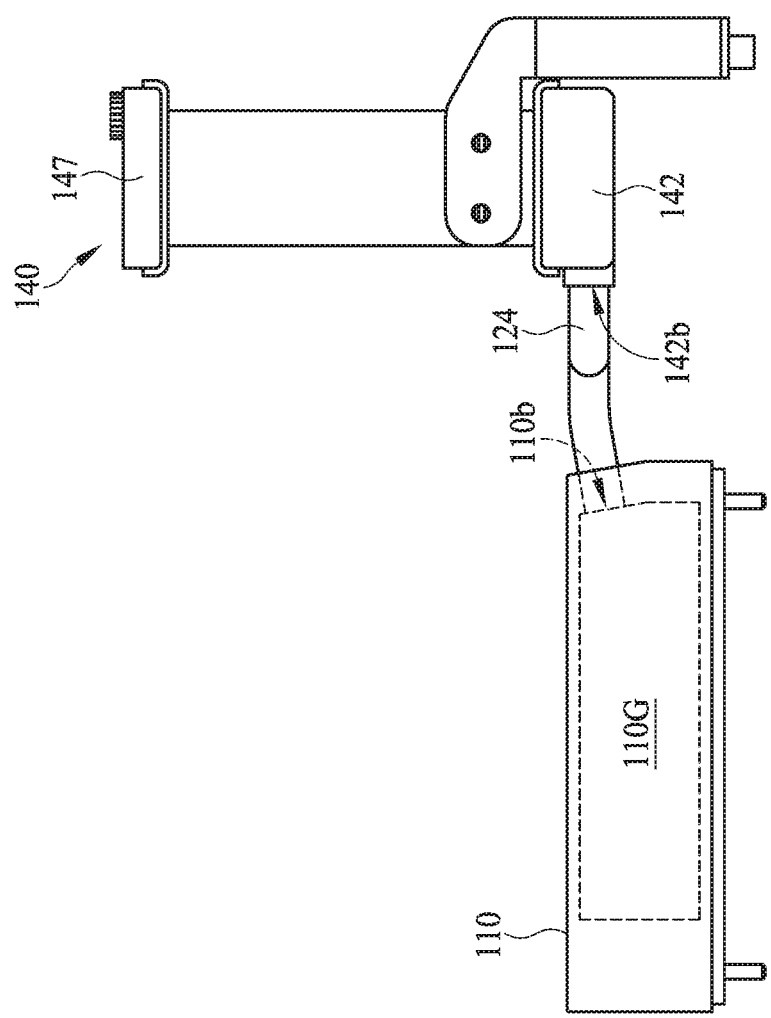

HEAT EXCHANGER WITH IMPROVED HEAT REMOVING EFFICIENCY

FIELD OF THE INVENTION

The present invention relates to a heat exchanger.

BACKGROUND OF THE INVENTION

A conventional water-cooling heat exchanger comprises a water-cooling head, a water-cooling radiator, a fan and a pump, which are in communication with each other through a piping system to define a loop. Moreover, water is filled in the loop. During the operation of the water-cooling heat exchanger, the heated water is transferred from the water-cooling head to the water-cooling radiator and the temperature of the water is decreased by the fan and fins. In addition, the water is returned back to the water-cooling head by the pump.

However, the amount of heat to be removed by the water-cooling heat exchanger is limited. Therefore, the heat exchanger needs to be further improved.

SUMMARY OF THE INVENTION

For overcoming the drawbacks of the conventional technologies, the present invention provides a heat exchanger with enhanced heat dissipation performance.

In accordance with an aspect of the present invention, a heat exchanger is provided. The heat exchanger includes a heat-absorbing part, at least two vapor conduits, a return conduit and a condensing part. The heat-absorbing part includes a vapor zone and a liquid zone. A first end of each vapor conduit is connected with the vapor zone of the heat-absorbing part. A first end of the return conduit is connected with the liquid zone of the heat-absorbing part. The condensing part includes a vapor-inputting chamber, a liquid-outputting chamber, a partition plate, a communication chamber, a first condenser tube group and a second condenser tube group. The vapor-inputting chamber is connected with a second end of each vapor conduit. The liquid-outputting chamber and the vapor-inputting chamber are horizontally arranged side by side. The liquid-outputting chamber is connected with a second end of the return conduit. The partition plate is arranged between the vapor-inputting chamber and the liquid-outputting chamber. The vapor-inputting chamber and the liquid-outputting chamber are separated from each other by the partition plate. The communication chamber is located over the vapor-inputting chamber and the liquid-outputting chamber. The first condenser tube group includes plural first condenser tubes. The plural first condenser tubes are connected between the vapor-inputting chamber and the communication chamber. The second condenser tube group and the first condenser tube group are horizontally arranged side by side. The second condenser tube group includes plural second condenser tubes. The plural second condenser tubes are connected between the communication chamber and the liquid-outputting chamber.

In an embodiment, the vapor-inputting chamber includes at least two gas inlets, and the at least two gas inlets are connected with the at least two vapor conduits, respectively. The liquid-outputting chamber has a liquid outlet, and the liquid outlet is connected with the return conduit. The relative elevations of the at least two gas inlets and the relative elevation of the liquid outlet are identical or substantially identical.

In an embodiment, the vapor zone includes at least two vents, and the vapor-inputting chamber includes at least two gas inlets. The relative elevations of the at least two vents and the relative elevations of the at least two gas inlets are identical or substantially identical.

In an embodiment, the number of the plural first condenser rubes is larger than the number of the plural second condenser tubes.

In an embodiment, the volume of the vapor zone is larger than tubes is larger than the volume of the liquid zone.

In an embodiment, the volume of the communication chamber is larger than the volume of the vapor-inputting chamber.

In an embodiment, a total length of the vapor-inputting chamber and the liquid-outputting chamber is equal or substantially equal to a length of the communication chamber.

In an embodiment, one of the at least vapor conduits is a straight conduit.

In an embodiment, the return conduit is a straight conduit.

In an embodiment, the condensing part further includes plural fins, and the fins are arranged between every two adjacent first condenser tubes and arranged between every two adjacent second condenser tubes.

In accordance with the present invention, the heat exchanger comprises at least two vapor conduits rather than one vapor conduit. Consequently, the gaseous working medium can be transferred to the vapor-inputting chamber quickly, and the gaseous working medium can be quickly distributed to the plural first condenser tubes and cooled down. In this way, the heat dissipation performance of the heat exchanger is enhanced.

The above objects and advantages of the present invention will become more readily apparent to those ordinarily skilled in the art after reviewing the following detailed description and accompanying drawings, in which:

BRIEF DESCRIPTION OF THE DRAWINGS

FIG. 4 is a schematic top view illustrating the heat-absorbing part and the condensing part of the heat exchanger according to the embodiment of the present invention.

DETAILED DESCRIPTION OF THE PREFERRED EMBODIMENT

Figure 1:
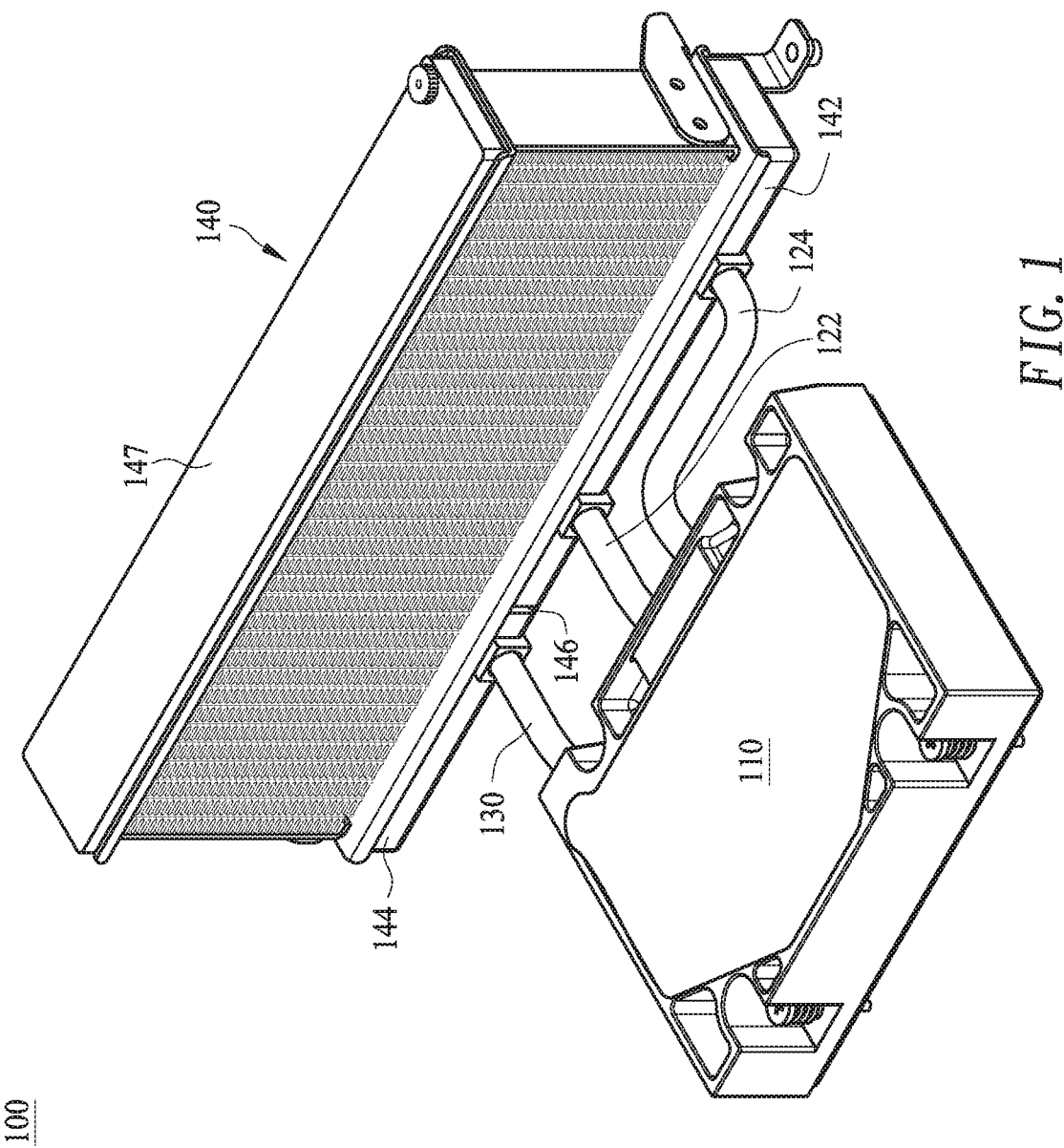
FIG. 1 is a schematic perspective view illustrating a heat exchanger according to an embodiment of the present invention.

FIG. 1 is a schematic perspective view illustrating a heat exchanger according to an embodiment of the present invention. As shown in FIG. 1, the heat exchanger 100 comprises a heat-absorbing part 110, at least two vapor conduits 122, 124, a return conduit 130 and a condensing part 140. A loop is defined by the heat-absorbing part 110, the at least two vapor conduits 122, 124, the condensing part 140 and the return conduit 130 collaboratively. Moreover, a working medium is filled in the loop. Initially, the working medium is in a liquid state. After the working medium absorbs heat, the working medium is transformed to a gaseous state to carry away a great amount of heat. In an embodiment, the working medium is water or an engineered fluid with a low boiling point. For example, the working medium is 3M™ Fluorinert™ Electronic Liquid FC-72 (boiling point is 56 degree Celsius), 3M™ Novec™ 7000 Engineered Fluid (boiling point is 34 degree Celsius) or 3M™ Novec™ Engineered Fluid 7100 (boiling point is 61 degree Celsius). As long as the working medium is transformed into the gaseous state after heat absorption and the working medium has the capability to carry away a great deal of heat during expansion and pressurization, the example of the working medium is not restricted.

Figure 2:
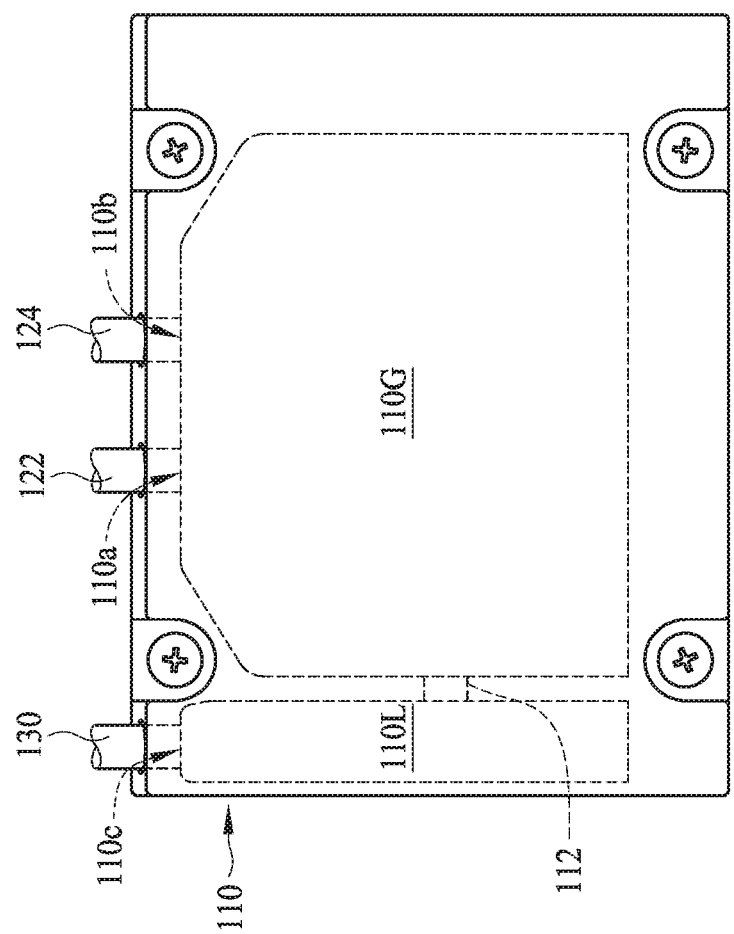
FIG. 2 is a schematic top view illustrating the heat-absorbing part, the two vapor conduits and the return conduit of the heat exchanger according to the embodiment of the present invention.

FIG. 2 is a schematic top view illustrating the heat-absorbing part, the two vapor conduits and the return conduit of the heat exchanger according to the embodiment of the present invention. A bottom surface of the heat-absorbing part 110 is in thermal contact with a heat source. For example, the bottom surface of the heat-absorbing part 110 is directly attached on the heat source, or an intermediate medium (e.g., a thermal grease, an adhesive or a soldering material) is clamped between the heat-absorbing part 110 and the heat source. Preferably, the vacuum state of the heat-absorbing part 110 is previously created, and a working medium is filled in the heat-absorbing part 110. In an embodiment, the bottom side of the heat-absorbing part 110 is made of metallic material with high thermal conductivity (e.g., silver, copper, gold, aluminum or iron). In another embodiment, the bottom side of the heat-absorbing part 110 is made of non-metallic material with high thermal conductivity (e.g., graphite).

Please refer to FIG. 2. The heat-absorbing part 110 comprises a vapor zone 110G (also referred as a vapor chamber) and a liquid zone 110L (also referred as a return chamber). After the working medium within the vapor zone 110G absorbs heat, the working medium is transformed from the liquid state into the gaseous state. Then, the working medium in the gaseous state is outputted from vents of the vapor zone 110G. In the embodiment as shown in FIG. 2, the vapor zone 110G comprises at least two vents 110a and 110b. As the number of vents increases, the gaseous working medium can be outputted from the vapor zone 110G more quickly. In an embodiment, the liquid zone 110L has a liquid inlet 110c. Moreover, a communication channel 112 is arranged between the vapor zone 110G and the liquid zone 110L. The vapor zone 110G and the liquid zone 110L are in communication with each other through the communication channel 112. In an embodiment, the volume of the vapor zone 110G is larger than the volume of the liquid zone 110L.

Please refer to FIGS. 1 and 2. The first ends of the two vapor conduits 122 and 124 are connected with the vapor zone 110G of the heat-absorbing part 110. Consequently, the gaseous working medium can be transferred from the vapor zone 110G to the condensing part 140 through the vapor conduits 122 and 124.

Please refer to FIGS. 1 and 2 again. The first end of the return conduit 130 is connected with the liquid zone 110L of the heat-absorbing part 110. After the working medium in the condensing part 140 is condensed, the working medium is returned back to the liquid zone 110L through the return conduit 130.

Figure 3:
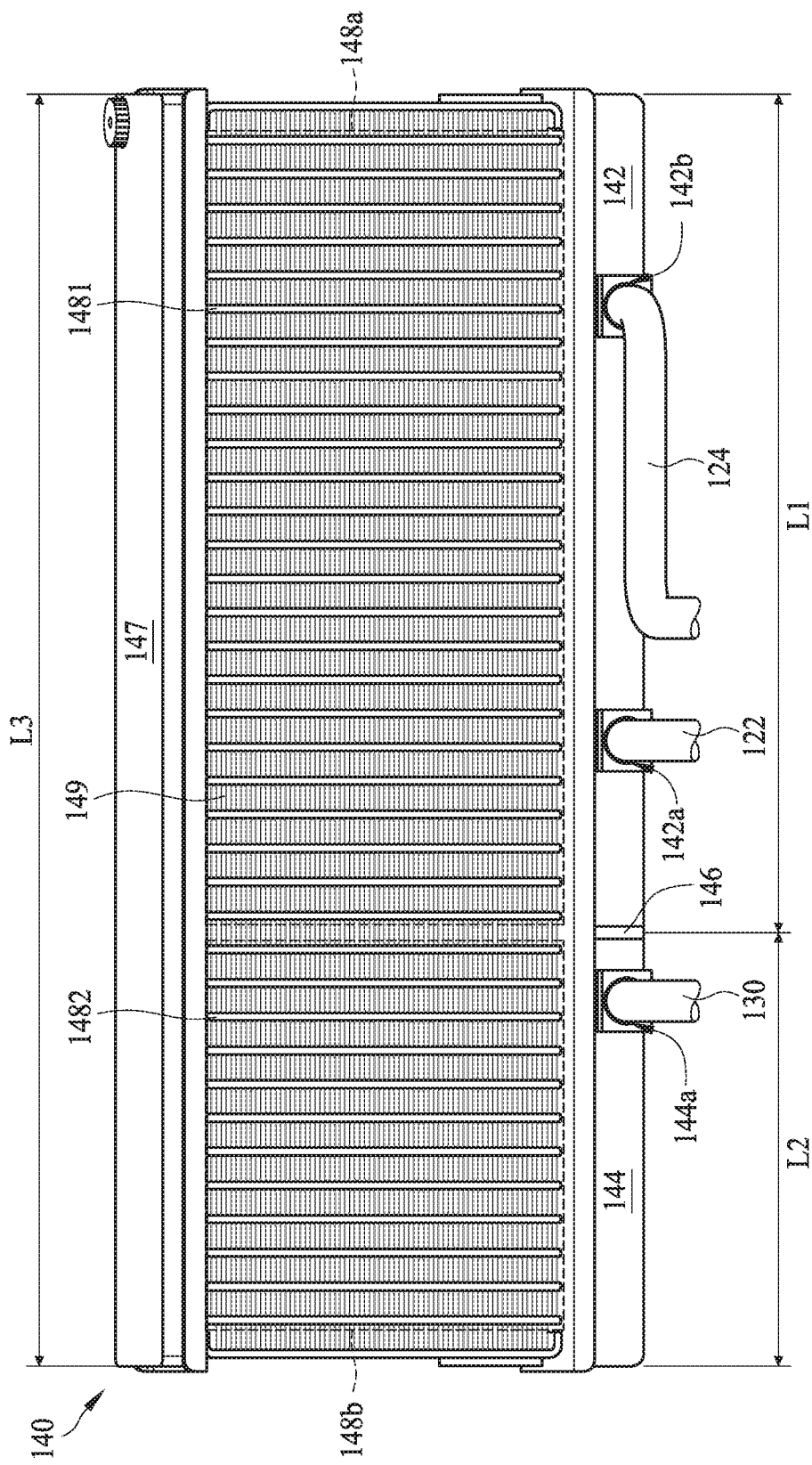
FIG. 3 is a schematic side view illustrating the condensing part of the heat exchanger according to the embodiment of the present invention.

FIG. 3 is a schematic side view illustrating the condensing part of the heat exchanger according to the embodiment of the present invention. As shown in FIG. 3, the condensing part 140 comprises a vapor-inputting chamber 142, a liquid-outputting chamber 144, a partition plate 146, a communication chamber 147, a first condenser tube group 148a and a second condenser tube group 148b. In the embodiment of FIG. 3, the condensing part 140 only comprises three chambers, i.e., the vapor-inputting chamber 142, the liquid-outputting chamber 144 and the communication chamber 147.

The vapor-inputting chamber 142 is connected with the second ends of the two vapor conduits 122 and 124. The vapor-inputting chamber 142 comprises at least two gas inlets 142a and 142b. The two gas inlets 142a and 142b are connected with the two vapor conduits 122 and 124, respectively. The gaseous working medium is transferred from the vapor zone 110G (see FIG. 2) to the vapor-inputting chamber 142 of the condensing part 140 through the two vapor conduits 122 and 124.

The liquid-outputting chamber 144 and the vapor-inputting chamber 142 are horizontally arranged side by side. The liquid-outputting chamber 144 is connected with the second end of the return conduit 130. Moreover, the liquid-outputting chamber 144 has a liquid outlet 144a. The liquid outlet 144a is connected with the return conduit 130. The condensed working liquid is transferred from the liquid-outputting chamber 144 to the liquid zone 110L (see FIG. 2) through the return conduit 130.

The partition plate 146 is arranged between the vapor-inputting chamber 142 and the liquid-outputting chamber 144. That is, the vapor-inputting chamber 142 and the liquid-outputting chamber 144 are separated from each other by the partition plate 146. In an embodiment, the volume of the vapor-inputting chamber 142 is larger than the volume of the liquid-outputting chamber 144. Due to the arrangement of the partition plate 146, the gaseous working medium in the vapor-inputting chamber 142 is not transferred to the liquid-outputting chamber 144.

The communication chamber 147 is located over the vapor-inputting chamber 142 and the liquid-outputting chamber 144. The first condenser tube group 148a comprises plural first condenser tubes 1481. The plural first condenser tubes 1481 are connected between the vapor-inputting chamber 142 and the communication chamber 147. The second condenser tube group 148b and the first condenser tube group 148a are horizontally arranged side by side. The second condenser tube group 148b comprises plural second condenser tubes 1482. The plural second condenser tubes 1482 are connected between the communication chamber 147 and the liquid-outputting chamber 144. After the gaseous working medium is introduced into the vapor-inputting chamber 142, the gaseous working medium is pushed into the plural first condenser tubes 1481 and cooled down. Then, the gaseous working medium is transferred to through the communication chamber 147, the plural second condenser tubes 1482 and the liquid-outputting chamber 144 sequentially and cooled down continuously. Consequently, the gaseous working medium is transformed into the liquid working medium. In an embodiment, the working medium is transferred along an inverted U-shaped path, which is maintained according to the output power of the heat-absorbing part 110.

In accordance with the present invention, the heat exchanger comprises at least two vapor conduits 122 and 124 rather than one vapor conduit. Consequently, the gaseous working medium can be transferred to the vapor-inputting chamber 142 quickly, and the gaseous working medium can be quickly distributed to the plural first condenser tubes 1481 and cooled down. In this way, the heat dissipation performance of the heat exchanger is enhanced.

In an embodiment, the number of the first condenser tubes 1481 is larger than the number of the second condenser tubes

1482. Due to the larger number of first condenser tubes 1481, the gaseous working medium within the vapor-inputting chamber 142 can be quickly distributed to the plural first condenser tubes 1481.

In an embodiment, the volume of the communication chamber 147 is larger than the volume of the vapor-inputting chamber 142. Due to the large volume of the communication chamber 147, the heat of the working medium in the communication chamber 147 can be continuously dissipated. In an embodiment, the sum of the length L1 of the vapor-inputting chamber 142 and the length L2 of the liquid-outputting chamber 144 is equal or substantially equal to the length L3 of the communication chamber 147. In an embodiment, the length of the first condenser tube 1481 or the length of the second condenser tube 1482 is shorter than the length L3 of the communication chamber 147.

In an embodiment, the condensing part 140 further comprises plural fins 149. The fins 149 are arranged between every two adjacent first condenser tubes 1481 and arranged between every two adjacent second condenser tubes 1482. The uses of the fins 149 can increase the efficacy of dissipating the heat of the working medium.

FIG. 4 is a schematic top view illustrating the heat-absorbing part and the condensing part of the heat exchanger according to the embodiment of the present invention. As shown in FIGS. 1 and 4, the relative elevations of the at least two vents 110a and 110b and the relative elevations of the at least two gas inlets 142a and 142b are identical or substantially identical. The applicant found that the vent and the gas inlet with the same relative elevation (or substantially the same relative elevation) do not adversely affect the heat dissipation performance of the heat exchanger when compared with the conventional design having the relative elevation difference between the vent and the gas inlet. In other words, even if the vent and the gas inlet have the same relative elevation (or substantially the same relative elevation), the heat dissipation performance of the heat exchanger is still satisfied. Moreover, since there is no relative elevation difference between the vent and the gas inlet, the designing cost is reduced and occupied space is reduced. It is noted that numerous modifications and alterations may be made while retaining the teachings of the invention. For example, in some other embodiments, the relative elevations of the at least two vents and the relative elevations of the at least two gas inlets are different.

In the embodiment of FIG. 3, the relative elevations of the at least two gas inlets 142a and 142b and the relative elevation of the liquid outlet 144a are identical or substantially identical. The applicant found that the gas inlet and the liquid outlet with the same relative elevation (or substantially the same relative elevation) do not adversely affect the heat dissipation performance of the heat exchanger when compared with the conventional design having the relative elevation difference between the gas inlet and the liquid outlet (e.g., the gas inlet higher than the liquid outlet allows the entering vapor falls down naturally through the force of gravity). In other words, even if gas inlet and the liquid outlet have the same relative elevation (or substantially the same relative elevation), the heat dissipation performance of the heat exchanger is still satisfied. Moreover, since there is no relative elevation difference between the gas inlet and the liquid outlet, the designing cost is reduced and occupied space is reduced. It is noted that numerous modifications and alterations may be made while retaining the teachings of the invention. For example, in some other embodiments, the relative elevations of the at least two gas inlets and relative elevation of the liquid outlet are different.

In an embodiment, at least one of the vapor conduits 122 and 124 is a straight conduit. Consequently, the gaseous working medium can be transferred to the vapor-inputting chamber 142 along a short path. Due to the straight conduit, the occupied space of the heat exchanger is reduced. Moreover, since the gaseous working medium is not condensed in the vapor conduit, the gaseous working medium can be transferred smoothly without being hindered by the liquid working medium. In the embodiment of FIG. 1, the vapor conduit 122 is a straight conduit. It is noted that numerous modifications and alterations may be made while retaining the teachings of the invention. For example, in some other embodiments, the two vapor conduits are straight conduits. In an embodiment, the return conduit 130 is a straight conduit. Consequently, the condensed working medium can be transferred to the liquid zone 110L along a short path.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all modifications and similar structures.

What is claimed is:

1. A heat exchanger, comprising:
   a heat-absorbing part comprising a vapor chamber and a return chamber;
   at least two vapor conduits, wherein a first end of each vapor conduit is connected with the vapor chamber of the heat-absorbing part;
   a return conduit, wherein a first end of the return conduit is connected with the return chamber of the heat-absorbing part; and
   a condensing part comprising:
     a vapor-inputting chamber connected with a second end of each vapor conduit;
     a liquid-outputting chamber, wherein the liquid-outputting chamber and the vapor-inputting chamber are horizontally arranged side by side, and the liquid-outputting chamber is connected with a second end of the return conduit;
     a partition plate arranged between the vapor-inputting chamber and the liquid-outputting chamber, wherein the vapor-inputting chamber and the liquid-outputting chamber are separated from each other by the partition plate;
     a communication chamber located over the vapor-inputting chamber and the liquid-outputting chamber;
     a first condenser tube group comprising plural first condenser tubes, wherein the plural first condenser tubes are connected between the vapor-inputting chamber and the communication chamber; and
     a second condenser tube group, wherein the second condenser tube group and the first condenser tube group are arranged side by side, the second condenser tube group comprises plural second condenser tubes, and the plural second condenser tubes are connected between the communication chamber and the liquid-outputting chamber,
   wherein the communication chamber is separated from the vapor-inputting chamber by the first condenser tube group.

2. The heat exchanger according to claim 1, wherein the vapor-inputting chamber comprises at least two gas inlets, and the at least two gas inlets are connected with the at least two vapor conduits, respectively, wherein the liquid-outputting chamber has a liquid outlet, and the liquid outlet is connected with the return conduit, wherein the relative elevations of the at least two gas inlets and the relative elevation of the liquid outlet are identical or substantially identical.

3. The heat exchanger according to claim 1, wherein the vapor chamber comprises at least two vents, and the vapor-inputting chamber comprises at least two gas inlets, wherein the relative elevations of the at least two vents and the relative elevations of the at least two gas inlets are identical or substantially identical.

4. The heat exchanger according to claim 1, wherein the number of the plural first condenser tubes is larger than the number of the plural second condenser tubes.

5. The heat exchanger according to claim 1, wherein the volume of the vapor chamber is larger than the volume of the return chamber.

6. The heat exchanger according to claim 1, wherein the volume of the communication chamber is larger than the volume of the vapor-inputting chamber.

7. The heat exchanger according to claim 1, wherein the sum of the length of the vapor-inputting chamber and the length of the liquid-outputting chamber is equal to the length of the communication chamber.

8. The heat exchanger according to claim 1, wherein one of the at least two vapor conduits is a straight conduit extending between the heat-absorbing part and the condensing part.

9. The heat exchanger according to claim 1, wherein the return conduit is a straight conduit extending between the heat-absorbing part and the condensing part.

10. The heat exchanger according to claim 1, wherein the condensing part further comprises plural fins, and the fins are arranged between any two adjacent first condenser tubes and arranged between any two adjacent second condenser tubes.

* * * * *